(12) United States Patent
Hu

(10) Patent No.: US 9,515,047 B2
(45) Date of Patent: Dec. 6, 2016

(54) HIGH PERFORMANCE PACKAGE AND PROCESS FOR MAKING

(71) Applicant: Chih-liang Hu, Taipei (TW)

(72) Inventor: Chih-liang Hu, Taipei (TW)

(*) Notice: Subject to any disclaimer, the term of this patent is extended or adjusted under 35 U.S.C. 154(b) by 0 days.

(21) Appl. No.: 14/643,862

(22) Filed: Mar. 10, 2015

(65) Prior Publication Data

US 2016/0268228 A1  Sep. 15, 2016

(51) Int. Cl.
  *H01L 21/52* (2006.01)
  *H01L 23/00* (2006.01)
  *H01L 21/48* (2006.01)
  *H01L 23/10* (2006.01)

(52) U.S. Cl.
  CPC .......... *H01L 24/97* (2013.01); *H01L 21/4867* (2013.01); *H01L 21/52* (2013.01); *H01L 23/10* (2013.01); *H01L 24/11* (2013.01); *H01L 24/17* (2013.01); *H01L 24/81* (2013.01); *H01L 2924/01013* (2013.01); *H01L 2924/01028* (2013.01); *H01L 2924/01029* (2013.01); *H01L 2924/01047* (2013.01); *H01L 2924/1203* (2013.01); *H01L 2924/1304* (2013.01); *H01L 2924/37001* (2013.01)

(58) Field of Classification Search
  CPC .............................. H01L 24/97; H01L 21/4867
  See application file for complete search history.

(56) References Cited

U.S. PATENT DOCUMENTS 7,603,771 B2 * 10/2009 Chang ................ H05K 1/186
  174/262
2008/0099770 A1 * 5/2008 Mendendorp .......... H01L 33/64
  257/79

* cited by examiner

*Primary Examiner* — Marc Armand
(74) *Attorney, Agent, or Firm* — Birch, Stewart, Kolasch & Birch, LLP

(57) ABSTRACT

A method for manufacturing circuit component package is disclosed. The method first forms copper circuits on a single-sided printed circuit board, and prints an electrically conductive paste on a plurality of predetermined locations on the copper circuits before positioning circuit dice of the circuit components on the locations printed with the electrically conductive paste. The method then forms a plurality of surface copper bumps on a copper plate, and prints the electrically conductive paste on each of the copper bumps. Then position and fit the printed circuit board on which the circuit dice are positioned relative to the copper plate on which the electrically conductive paste is printed such that each of the circuit dice aligns with the corresponding copper bump printed with the electrically conductive paste. Then inject a hermetic sealant into the space between the fitted printed circuit board and copper plate before forming at least two terminal electrodes of each package on a side opposite the copper plate and copper bumps by etching process. Then form plated through-holes in one of the terminal electrodes of each package so that the terminal electrode is electrically connected to the circuit dice via the copper circuit of the single-sided printed circuit board. Finally cut to separate the individual circuit components to form the package.

9 Claims, 15 Drawing Sheets

HIGH PERFORMANCE PACKAGE AND PROCESS FOR MAKING

TECHNICAL FIELD

The present invention generally relates to semiconductor circuit component packages and a method for manufacturing such packages and, in particular, to surface mount device packages with good heat dissipation suitable for high power application and a corresponding method for manufacturing such packages.

TECHNICAL BACKGROUND

Surface mount packages of discrete circuit components for such as diodes, light emitting diodes and thyristors are found in the form of, for example, (1) glass tube/plastic packages, (2) lead-frame-based leaded packages, (3) flat-pack leadless packages, and (4) flip-chip packages.

Among these common packages, flip-chip package is advantageously characterized by its light weight and compactness. However, its packaging is expensive. Flip-chip discrete components are currently a step away from commercialization also due to their difficulties in handling as well as poor reliability and short service life. The other three forms of packaging, by comparison, are dominant in the market of power-type packages. However, as the trend is toward better electrical performance and higher power, intrinsic problems of these components have arisen from insufficient structural thermal conductivity and the resultant high temperature that these packaging technologies are reaching their limitations. Other disadvantages to overcome include increased costs and technical difficulties in their packaging procedures and materials because of regulatory compliance with environmental regulations.

For surface mount, matured pick-and-place techniques for these packaging forms are available for mass production of leaded/leadless discrete circuit components. It is production yield, automation, and cost in connection with manufacturing of such discrete circuit components that have proved to be main issue for manufacturers. Among those issues, how the heat dissipation performance of these packaged components can be improved is among those to be addressed with priority.

SUMMARY OF THE INVENTION

It is therefore an object of the invention to provide a simplified fabrication of discrete circuit components as well as improved electrical characteristics (such as current, power, and aging characteristics), mechanical properties, and heat dissipation of these components.

It is another object of the invention to provide a process for packaging discrete circuit components that can simplify the fabrication procedures, improve automation and increase production yield, and therefore lowers the costs for manufacturing discrete circuit components.

It is yet another object of the invention to provide a selection of materials used in discrete circuit component packaging that are better compliant with environmental regulations, including the Restriction of Hazardous Substance Directive (RoHS), Halogen Free, and the Waste Electronics and Electrical Equipment Directive (WEEE). The selection of such materials also focuses on thermal conductive materials and their electrical and electro-thermal effects in eutectic bonding in order to bring about high quality and extended life for the components.

To achieve the foregoing objects and other ones, the present invention provides a method for manufacturing a circuit component package that includes forming copper circuits on a single-sided printed circuit board, and printing an electrically conductive paste on a plurality of predetermined locations on the copper circuits before positioning circuit dice of the circuit components on the locations printed with the electrically conductive paste. Then form a plurality of surface copper bumps on a copper plate, and print the electrically conductive paste on each of the copper bumps. Next, position and fit the printed circuit board on which the circuit dice are positioned relative to the copper plate on which the electrically conductive paste is printed such that each of the circuit dice aligns with the corresponding copper bump printed with the electrically conductive paste. Then inject a hermetic sealant into the space between the fitted printed circuit board and copper plate before forming at least two terminal electrodes of each package on a side opposite the copper plate and copper bumps by etching process. Then form plated through-holes in one of the terminal electrodes of each package so that the terminal electrode is electrically connected to the circuit dice via the copper circuit of the single-sided printed circuit board. Finally cut to separate the individual circuit components to form the package.

The present invention also provides a circuit component package manufactured in accordance with the method above, which comprising: a single-side printed circuit board, with a copper circuit printed thereon; a circuit dice, which has at least two electrodes and one of the electrodes is electrically connected to the copper circuit of the single-sided printed circuit board; and a plurality of surface copper bumps formed on a copper plate, wherein one of the copper bumps is electrically connected to the other electrode of the circuit dice, and another of the copper bumps is electrically connected to the copper circuit of the single-side printed circuit board via a plated through-hole in order to electrically connect to the other electrode of the circuit dice.

BRIEF DESCRIPTION OF THE DRAWINGS

FIGS. 2-1 and 2-2 are respectively top and cross-sectional view of a copper plate with surface copper bumps according to an embodiment of the present invention;

FIGS. 12-1 and 12-2 are respectively cross-sectional and bottom view of a finished package of a circuit component containing two coupled circuit dice that can be used in the present invention; and FIGS. 13-1 and 13-2 are respectively cross-sectional and bottom view of a finished package of an arrayed circuit component containing multiple independent circuit dice that can be used in the present invention.

DETAILED DESCRIPTION

Figure 1:
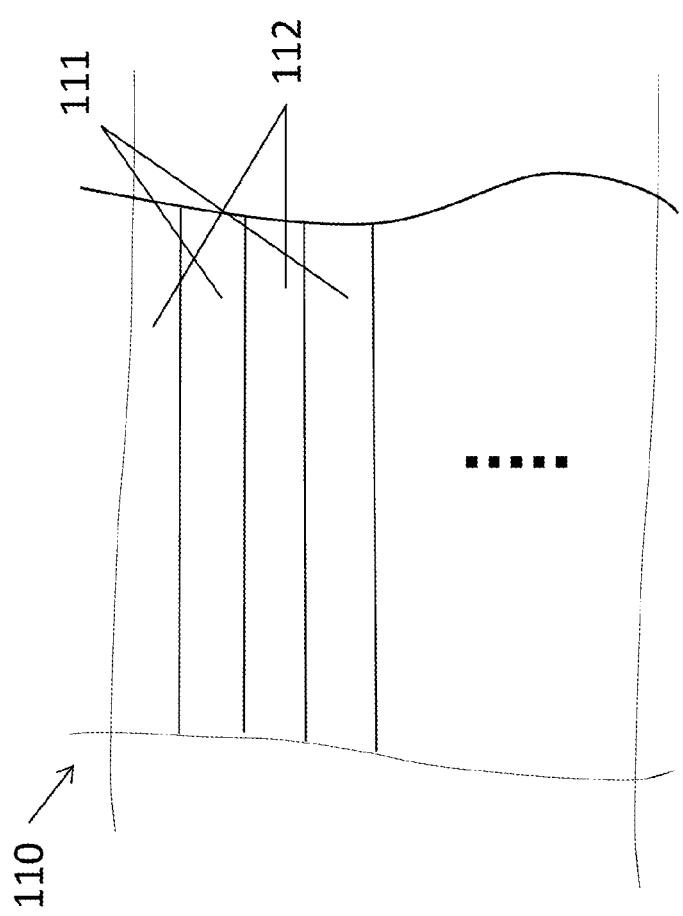
FIGS. 1-1 and 1-2 are respectively top and cross-sectional view of a single-sided printed circuit board according to an embodiment of the present invention.
Figures 1, 2:
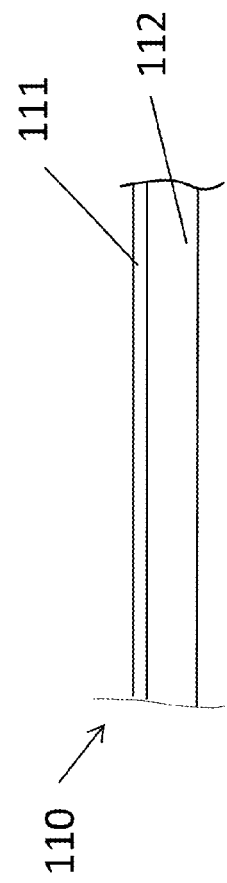
Figures 1, 2:
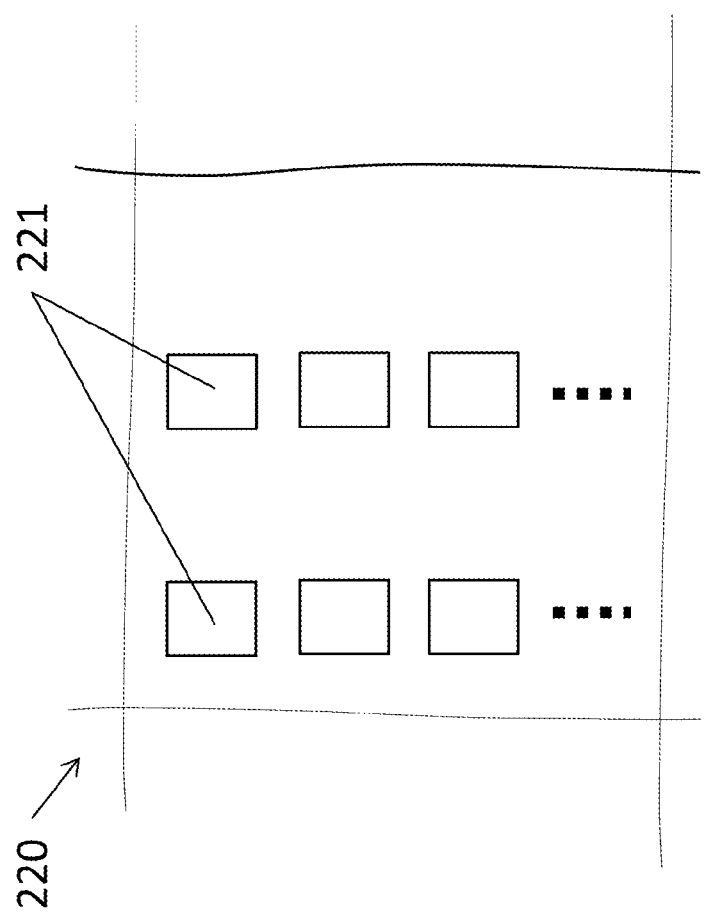
Figure 2:
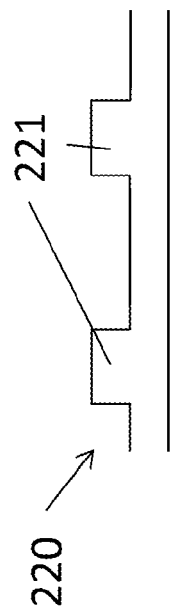

According to a preferred embodiment of the present invention, a printed circuit board commonly used in the industry, for example, a circuit board with FR4 as substrates 112, is provided to manufacture a single-side printed circuit board 110 shown in FIGS. 1-1 and 1-2. Strips of copper circuits 111 are formed on the surface of the printed circuit board 110. FIG. 1-1 is the top view of the board 110, and FIG. 1-2 is the cross-sectional view.

FIGS. 2-1 and 2-2 are respectively a top view and a cross-sectional view of a copper plate with surface copper bumps according to an embodiment of the present invention. As shown in the figures, a copper plate in appropriate thickness may be manufactured into a copper plate structure 220 with an arranged array of copper bumps 221 formed thereon by surface etching, or by copper plating on the surface to build up the thickness.

Figure 3:
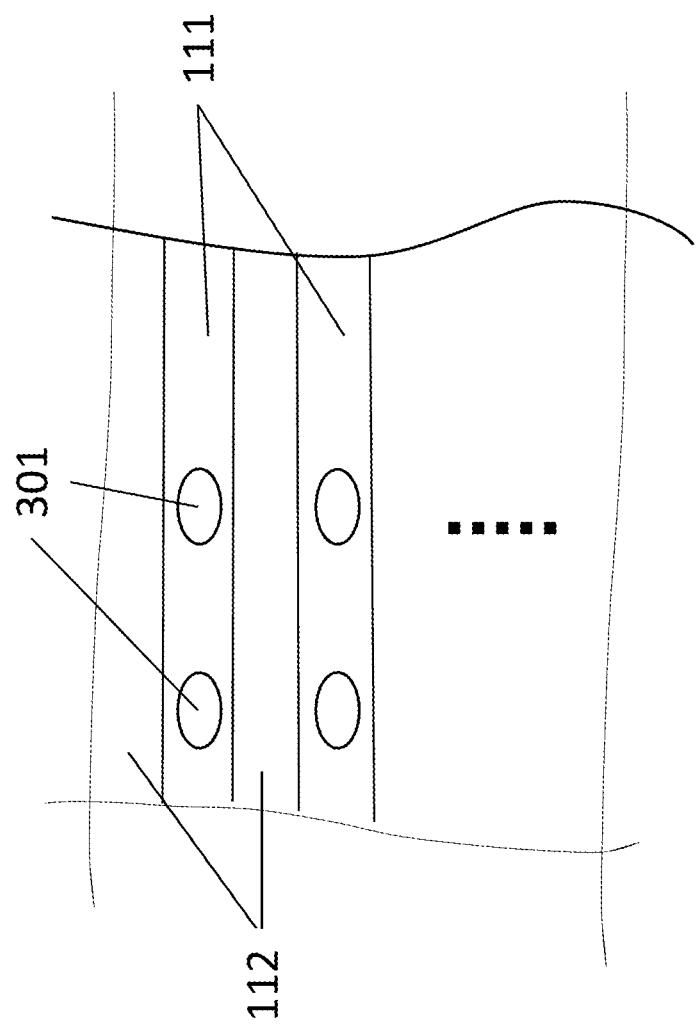
FIG. 3 schematically illustrates the printing of an electrically conductive paste on the metal areas of the printed circuit board of FIG. 1-1.
Figure 4:
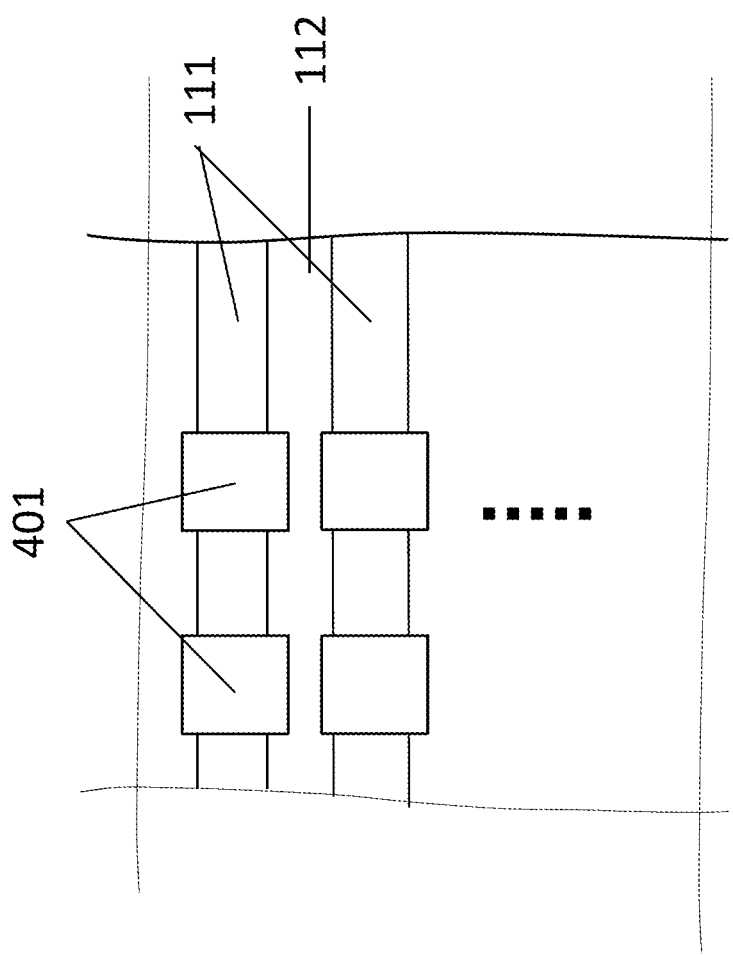
FIG. 4 schematically illustrates circuit dice positioned on the printed circuit board of FIG. 1-1 by die bonding at the locations printed with the electrically conductive paste shown in FIG. 3.

FIG. 3 schematically illustrates the steps of printing an electrically conductive paste on the metal areas of the printed circuit board of FIG. 1-1. First, dispense or print an electrically conductive paste 301 in appropriate amount at predetermined locations on the copper circuits 111 of the printed circuit board 110. Suitable electrically conductive pastes may be a paste of tin or lead and can also be an electrically conductive paste of silver, aluminum, nickel, copper, or alloys thereof. Then, circuit dice 401 may be arranged and positioned in sequence at the locations printed with the electrically conductive paste 301 through a die bonding process employing pick-and-place procedures to obtain the structure shown in FIG. 4. FIG. 4 illustrates the circuit dice being positioned on the printed circuit board of FIG. 1-1 by die bonding at the locations printed with the electrically conductive paste of FIG. 3.

Figure 5:
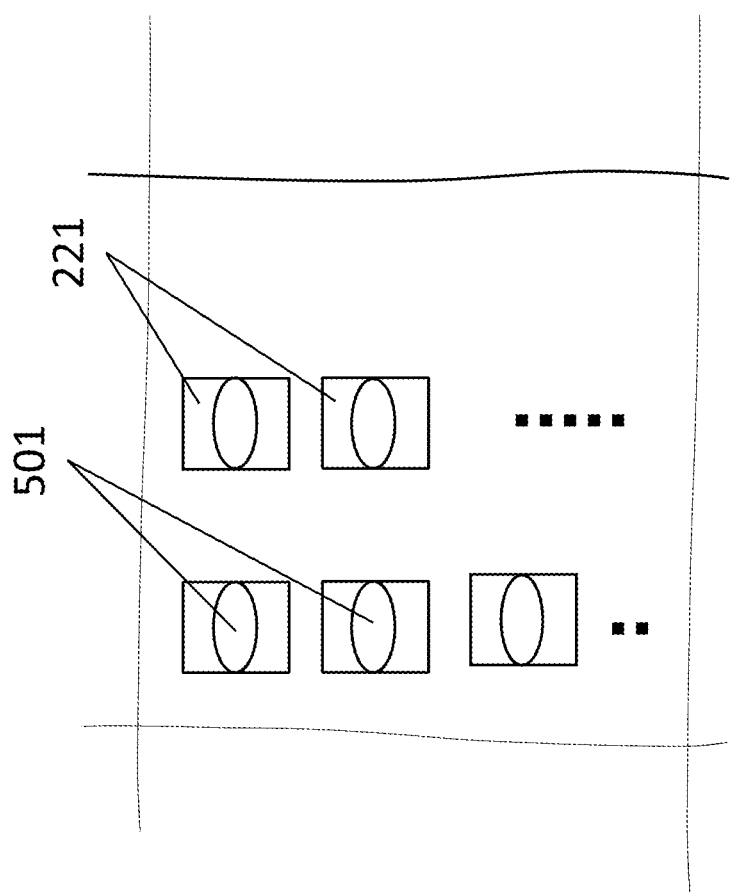
FIG. 5 schematically illustrates the printing of the electrically conductive paste on the copper bumps of FIG. 2-1.
Figure 6:
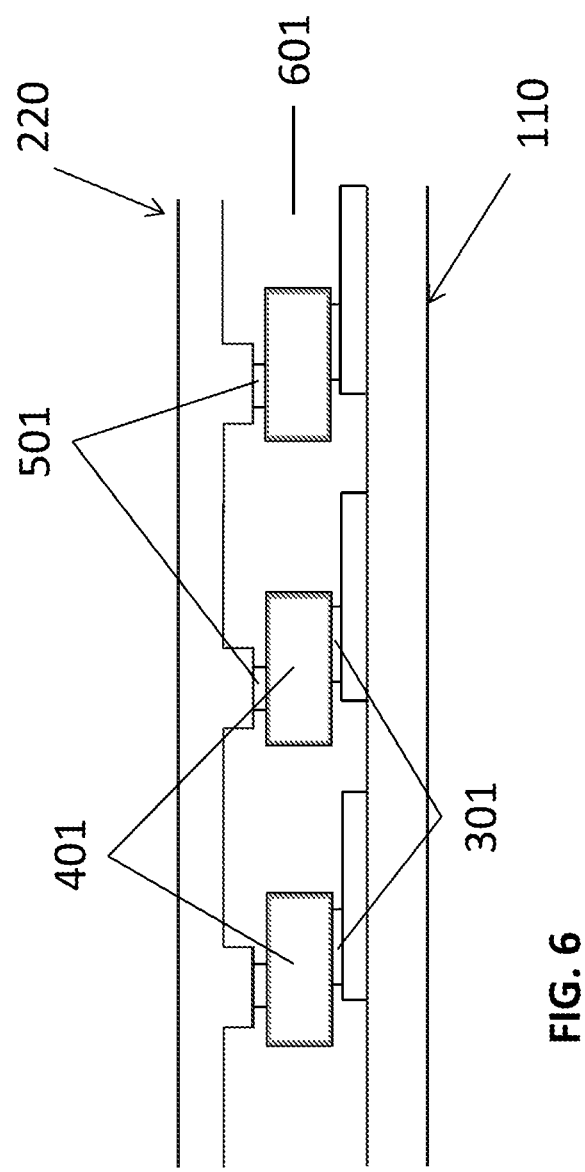
FIG. 6 is a cross-sectional view of the structures of FIG. 5 and FIG. 4 after being positioned and align-fitted relative to each other.

Next, screen-print or dispense an electrically conductive paste 501 in an appropriate amount on the copper bumps 221 of the copper plate 220 of FIG. 2, as shown in FIG. 5. Then position the copper plate already printed with the electrically conductive paste relative to the circuit dice 401 of FIG. 4 so that the locations printed with the electrically conductive paste align accurately with the circuit dice. After subjecting the aligned structure to a soldering furnace or high-temperature baking process, the electrical connection at the two ends of the circuit dice 401 is completed, namely, an electrical connection between the copper plate, the circuit dice, and the printed circuit board is established. FIG. 6 is a cross-sectional view of the structures of FIG. 5 and FIG. 4 after being positioned and fitted relative to each other.

Then, inject a viscous hermetic sealant 601 (for example, an insulating material of silicide, oxide, glass, epoxy resin, or 2-polyimide) into the space between the copper plate 220 and the printed circuit board 110, as shown in FIG. 6, and then subject the structure of FIG. 6 to a high-temperature curing process to obtain a hermetic protection surrounding the circuit dice 401.

Figure 7:
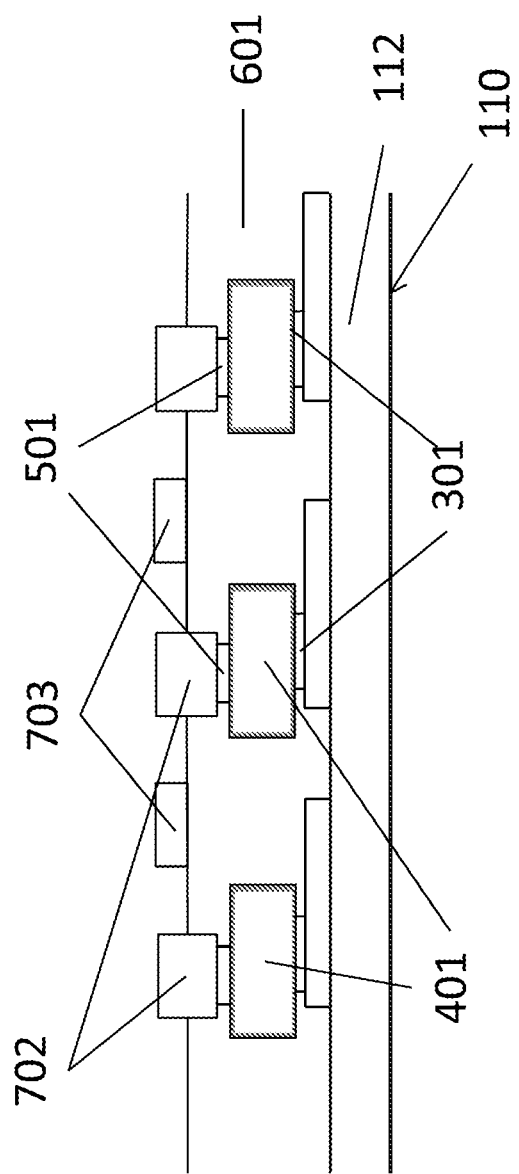
FIG. 7 is a cross-sectional view schematically illustrating a hermetic sealant injected into the space between the fitted printed circuit board and copper plate of FIG. 6 and terminal electrodes of the packages formed by an etching process.

Afterwards, apply a layer of photosensitive emulsion to the exposed surface of the copper plate 220 of FIG. 6 and then subject it to exposure, development, etching, and cleaning processes to obtain independent copper blocks 702 and 703. FIG. 7 is a cross-sectional view schematically illustrating a hermetic sealant injected into the space between the fitted printed circuit board and copper plate and then terminal electrodes of the packages formed by etching.

Figure 8:
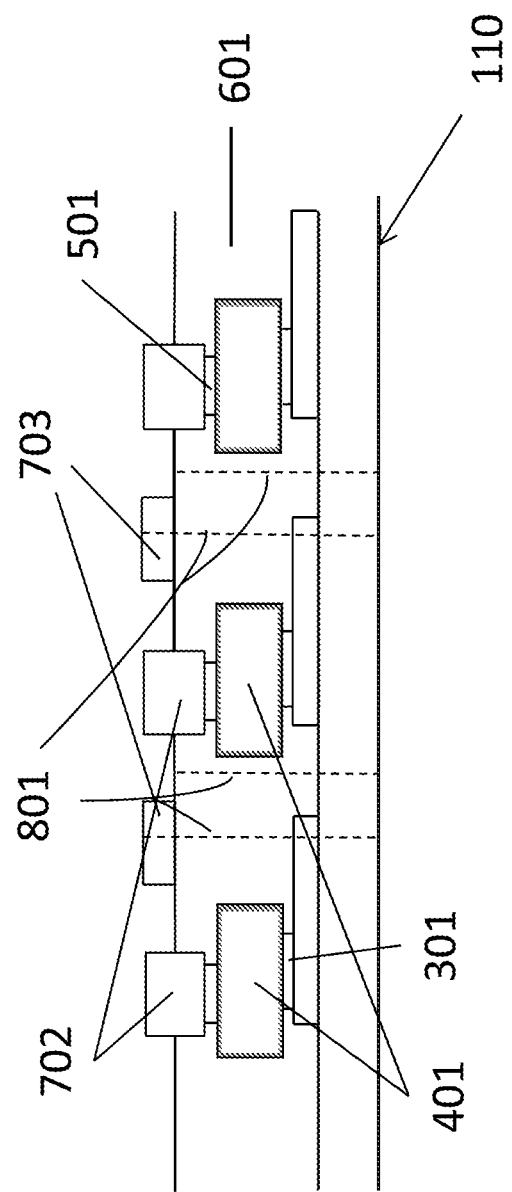
FIG. 8 is a cross-sectional view schematically illustrating the formation of plated through-holes in the structure of FIG. 7.

FIG. 8 is a cross-sectional view schematically illustrating the formation of plated through-holes 801 in the structure of FIG. 7 to establish electrical connection between the independent copper block 703 and the printed circuit board 110. The circuit dice 401 with top and bottom electrodes may electrically connect to the independent copper block 703 via the plated through-holes 801. The construction of the two conductive terminals of the circuit components of the present invention are thus completed by the independent copper blocks 702 and 703.

Figure 9:
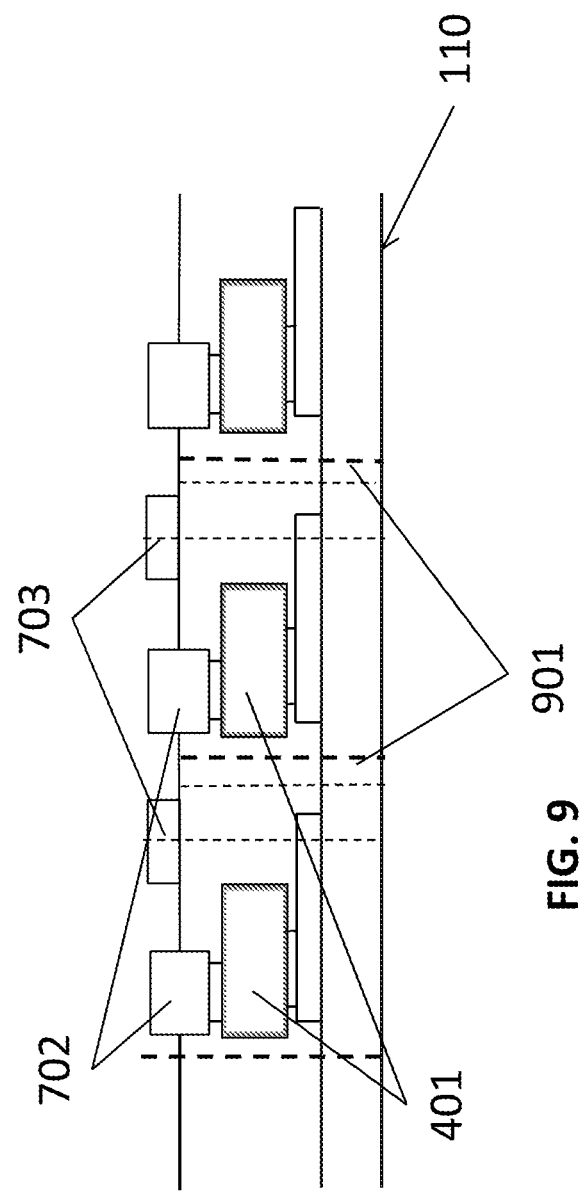
FIG. 9 schematically illustrates the cutting along the bold broken line longitudinally and transversely to separate the individual circuit components.
Figure 10:
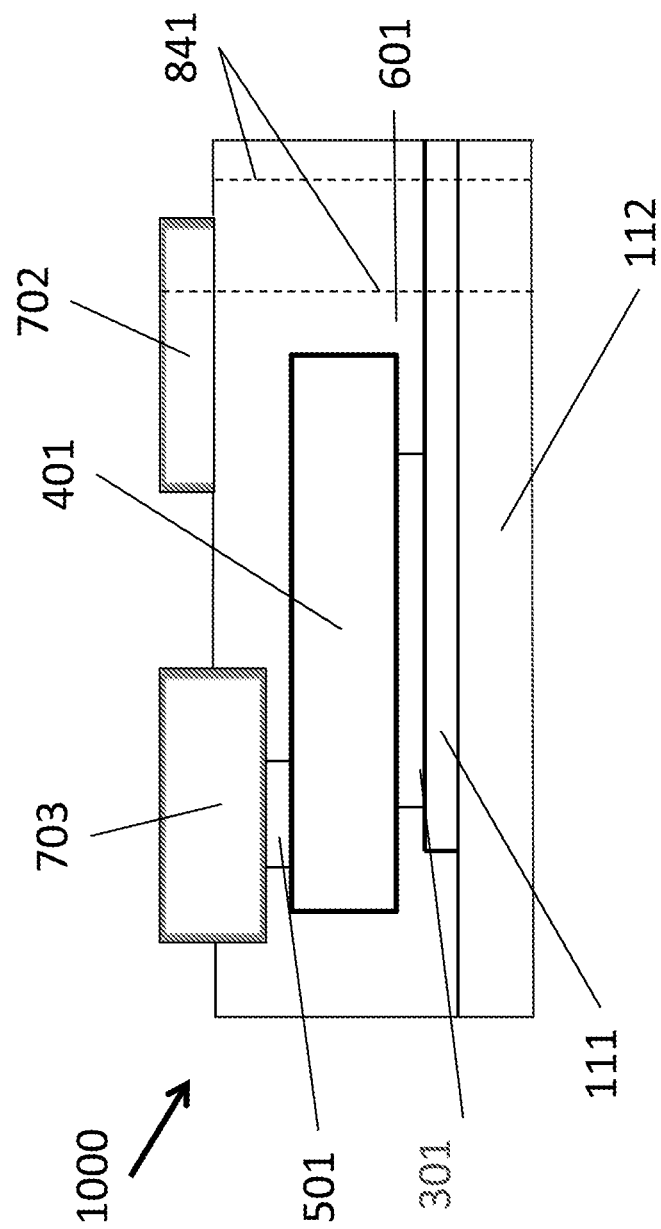
FIG. 10 is a cross-sectional view of the finished product of a circuit component package after being separated by cutting.

As shown in FIG. 9, the structure of FIG. 8 is cut along the bold broken line longitudinally and transversely to separate the individual circuit components. The cutting may be carried out along the bold broken line longitudinally and transversely using a diamond cutter or laser cutter to separate the individual circuit components. A component package 1000 is thus obtained, and a cross-sectional view of the package is shown in FIG. 10. The component package 1000 may be subject to a roller plating process to form the coating of the terminal electrodes. The composition of the coating may comprise nickel, tin, lead, silver, gold, copper, or alloys thereof FIG. 10 schematically illustrates another preferred embodiment of a circuit component package manufactured according the method of the present invention. Such a circuit component of high heat dissipation and high electric power may use diode dies with top and bottom electrodes as its circuit dice. Those in the art will understand that with respect to the discrete circuit component packages of the present invention described above, the useful circuit dice are not limited to diodes. For example, light emitting diodes, transistors, and thyristors may also be useful in the present invention. Also, the various features illustrated in the drawings accompanying the descriptions may not be drawn to the exact scale. Some dimensions of the views may be exaggerated for clarity.

Figure 11:
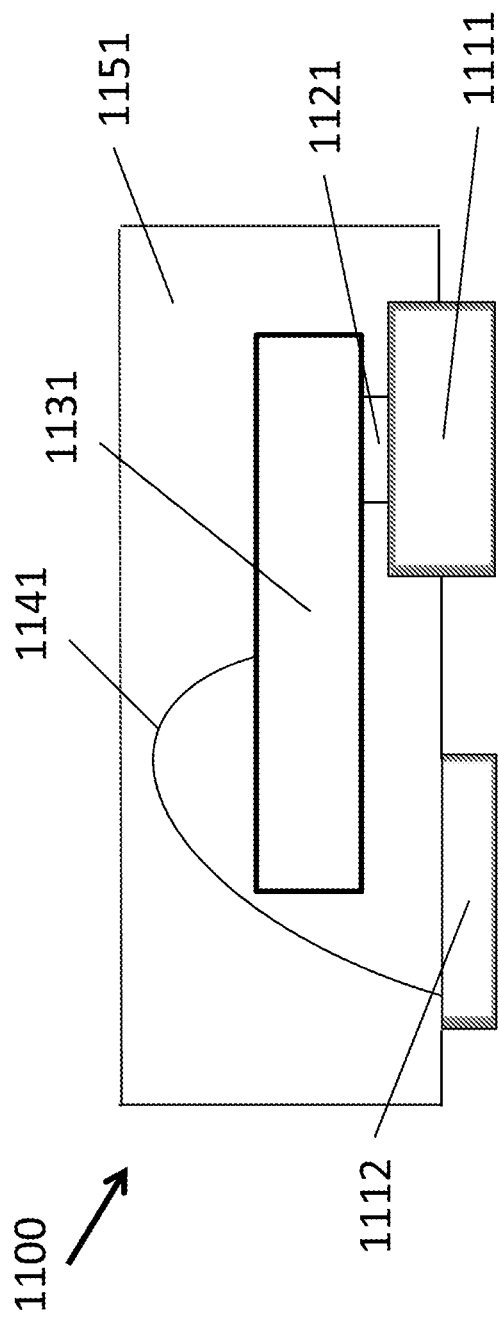
FIG. 11 is a cross-sectional view schematically illustrating another embodiment of the circuit component package according to the present invention wherein a metallic wire is used to bridge an electrode of the circuit component.

FIG. 11 is a cross-sectional view schematically illustrating another embodiment of the finished package according to the present invention wherein a metallic wire is used to bridge an electrode of the circuit component. The package 1100 differs from the package 1000 in that in the interior of the package 1100, a metallic wire 1141 (it may be a gold, aluminum, silver, or copper wire) is used for conducting purposes, this is instead of the copper circuits 111 of the printed circuit board and the plated through-holes 841 of the package 1000.

Figures 1, 12:
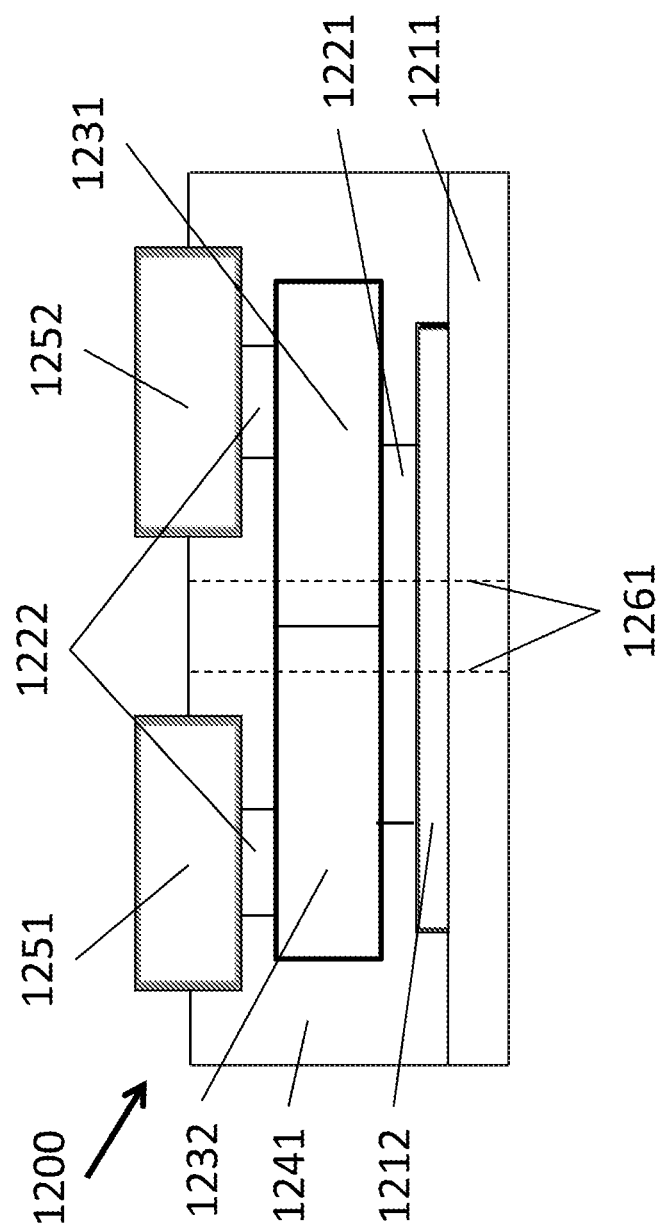
Figures 2, 12:
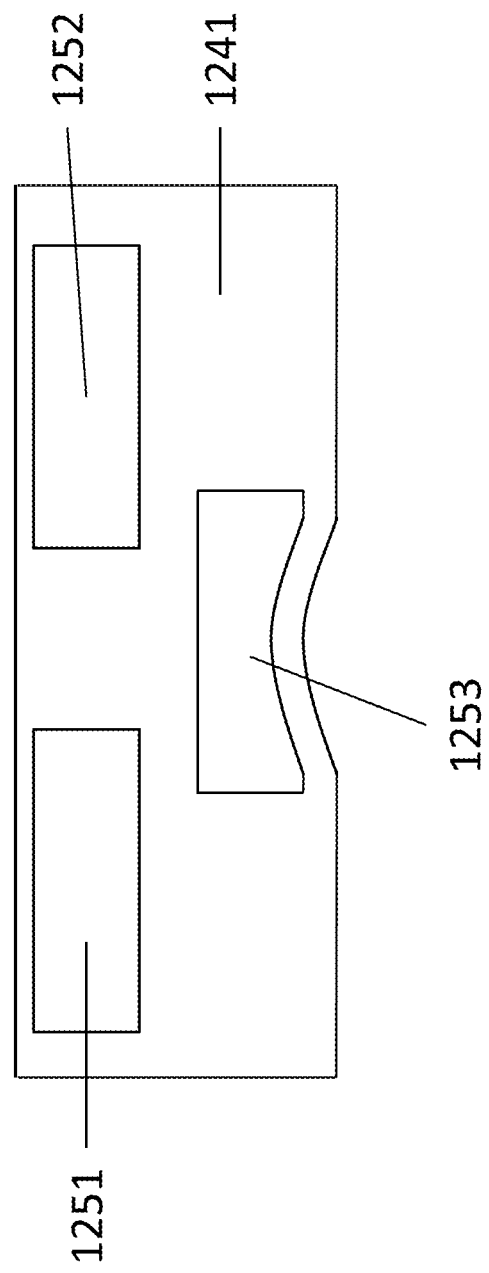

FIGS. 12-1 and 12-2 are respectively cross-sectional and bottom view of a finished package of a circuit component containing two coupled circuit dice that can be used in the present invention. Package 1200 differs from 1000 in that two coupled circuit dice 1231, 1232 replace the single circuit dice 401 with top and bottom electrodes (FIG. 10, the package 1000). FIG. 12-2 is the bottom view of the terminal electrodes 1251, 1252 and 1253 of the package 1200.

Figures 1, 13:
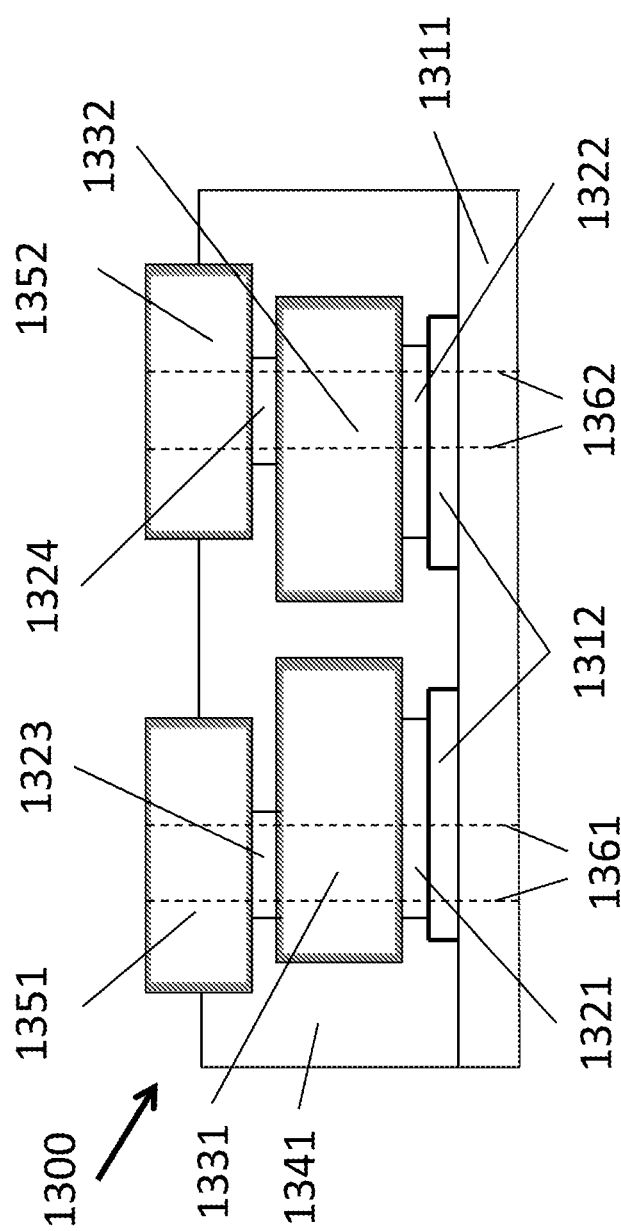
Figures 2, 13:
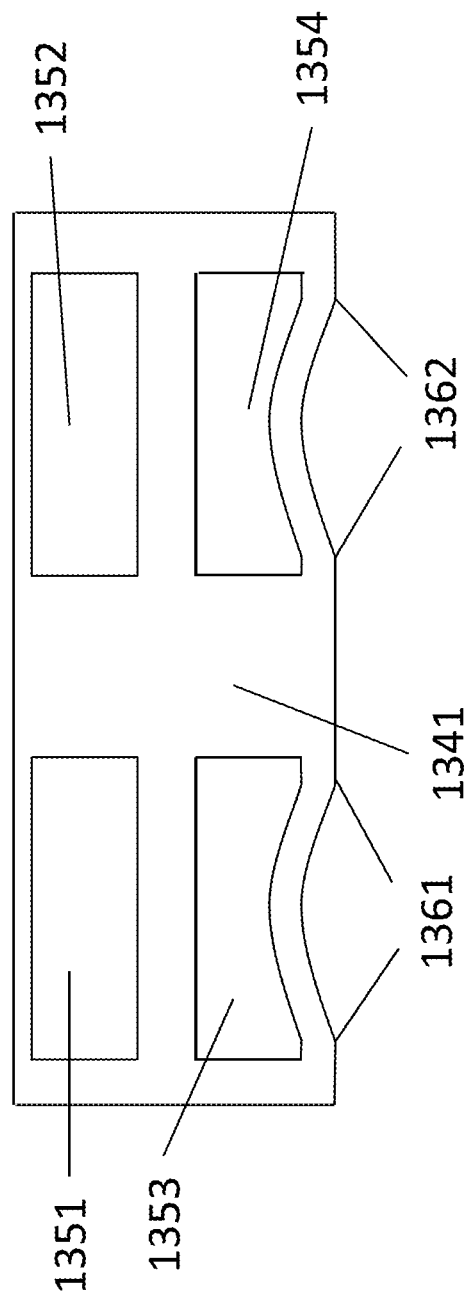

FIGS. 13-1 and 13-2 are respectively cross-sectional and bottom view of a finished package of an array of circuit components containing multiple independent circuit dice that can be used in the present invention. Package 1300 differs from 1200 in that multiple independent circuit dice 1331, 1332 replace the coupled circuit dice 1231, 1232 of the package 1200.

Although the preferred embodiments of the present invention have been described as above, they do not limit the scope of the invention. Various alterations and modifications to the disclosure will become apparent to those skilled in the art from the description without departing from the spirit of the present invention. The present invention is defined by the scope of the appended claims and their legal equivalents.

The invention claimed is:

1. A method for manufacturing a package for circuit component, the method comprising:
    forming copper circuits on a single-sided printed circuit board, and printing an electrically conductive paste on a plurality of predetermined locations on the copper circuits before positioning circuit dice of the circuit components on the locations printed with the electrically conductive paste;
    forming a plurality of surface copper bumps on a copper plate, and printing the electrically conductive paste on each of the copper bumps;
    positioning and fitting the printed circuit board on which the circuit dice are positioned relative to the copper plate on which the electrically conductive paste is printed such that each of the circuit dice aligns with the corresponding copper bump on which the electrically conductive paste has been printed;
    injecting a hermetic sealant into the space between the fitted printed circuit board and copper plate before forming at least two terminal electrodes of each package on a side opposite the copper plate and copper bumps by etching process;
    forming plated through-holes in one of the terminal electrodes of each package so that the terminal electrode is electrically connected to the circuit dice via the copper circuit of the single-sided printed circuit board; and
    cutting to separate the individual circuit components to form the package.

2. The method of claim 1 wherein the circuit component is a diode.

3. The method of claim 1 wherein the circuit component is a transistor.

4. The method of claim 1 wherein the single-sided printed circuit board is an FR4 printed circuit board.

5. The method of claim 1 wherein the electrically conductive paste is a paste of tin or lead, and can also be an electrically conductive paste of silver, aluminum, nickel, copper, or alloys thereof.

6. The method of claim 1 wherein the hermetic sealant is an insulating material of silicide, oxide, glass, epoxy resin, or 2-polyimide.

7. The method of claim 1, further comprising:
    subjecting the circuit component packages to roller plating to form the coating of the terminal electrodes.

8. The method of claim 7 wherein the composition of the coating comprises nickel, tin, lead, silver, gold, copper, aluminum, or alloys thereof.

9. A circuit component package comprising:
    a single-side printed circuit board, with a copper circuit printed thereon;
    a circuit dice, which has at least two electrodes and one of the electrodes is electrically connected to the copper circuit of the single-sided printed circuit board; and
    a plurality of surface copper bumps formed on a copper plate, wherein one of the copper bumps is electrically connected to the other electrode of the circuit dice, and another of the copper bumps is electrically connected to the copper circuit of the single-side printed circuit board via a plated through-hole in order to electrically connect to the other electrode of the circuit dice.

* * * * *